(12) United States Patent
Yamagami

(10) Patent No.: US 7,701,783 B2
(45) Date of Patent: Apr. 20, 2010

(54) SEMICONDUCTOR STORAGE DEVICE

(75) Inventor: Yoshinobu Yamagami, Osaka (JP)

(73) Assignee: Panasonic Corporation, Osaka (JP)

( * ) Notice: Subject to any disclaimer, the term of this patent is extended or adjusted under 35 U.S.C. 154(b) by 85 days.

(21) Appl. No.: 12/209,748

(22) Filed: Sep. 12, 2008

(65) Prior Publication Data

US 2009/0161449 A1 Jun. 25, 2009

(30) Foreign Application Priority Data

Dec. 19, 2007 (JP) ............................... 2007-326882

(51) Int. Cl.
*G11C 7/10* (2006.01)
*G11C 7/22* (2006.01)
*G11C 7/00* (2006.01)
(52) U.S. Cl. .............................. 365/189.06; 365/189.16
(58) Field of Classification Search ............. 365/189.06
See application file for complete search history.

(56) References Cited

U.S. PATENT DOCUMENTS

| 4,322,820 | A | * | 3/1982 | Toyoda ........................ 365/155 |
| 4,432,076 | A | * | 2/1984 | Yamada et al. .............. 365/190 |
| 4,451,907 | A | * | 5/1984 | Donoghue et al. .......... 365/203 |
| 4,563,754 | A | * | 1/1986 | Aoyama et al. ............. 365/190 |
| 4,791,613 | A | * | 12/1988 | Hardee ................... 365/189.09 |
| 4,910,711 | A | * | 3/1990 | Guo ....................... 365/189.06 |
| RE35,154 | E | * | 2/1996 | Hardee ................... 365/189.09 |
| 5,491,655 | A | * | 2/1996 | Hirose et al. ................. 365/177 |
| 5,574,687 | A | | 11/1996 | Nakase |
| 6,671,201 | B2 | | 12/2003 | Masuda |
| 6,915,251 | B2 | * | 7/2005 | Becker ......................... 703/14 |
| 7,242,609 | B2 | | 7/2007 | Tokito |
| 7,577,014 | B2 | * | 8/2009 | Yamagami ................... 365/154 |

FOREIGN PATENT DOCUMENTS

JP 2005-071491 A 3/2005

* cited by examiner

*Primary Examiner*—Son L Mai
(74) *Attorney, Agent, or Firm*—McDermott Will & Emery LLP

(57) ABSTRACT

A semiconductor storage device has memory cells provided at intersections of word lines and bit lines, a precharge circuit connected to the bit lines, and a write circuit. The write circuit includes a column selection circuit controlled by a write control signal, a transistor for controlling a potential of a selected bit line so that the potential of the selected bit line is a first potential (e.g., 0 V), a capacitance element for controlling the potential of the selected bit line so that the potential of the selected bit line is a second potential (e.g., a negative potential) that is lower than the first potential, and a clamp circuit for clamping the second potential when a power supply voltage becomes high.

20 Claims, 7 Drawing Sheets

SEMICONDUCTOR STORAGE DEVICE

BACKGROUND OF THE INVENTION

1. Field of the Invention

The present invention relates to a semiconductor storage device, such as a static random access memory, and more particularly, to a technique of controlling the voltage of a bit line.

2. Description of the Related Art

In recent years, as miniaturization of semiconductor processes has been advanced, the reliability (resistance to electrical stress, thermal stress or the like) of semiconductor elements has decreased. Also, as the area of a semiconductor storage device has been reduced, it has been increasingly difficult to secure a stable characteristic of, particularly, a memory cell in the semiconductor storage device.

In a typical semiconductor storage device, such as a static random access memory, data is written into a memory cell by causing the potential of either one of a pair of bit lines precharged to the H level to go from the H level to the L level.

In contrast to this, there is a known technique of improving a write characteristic to a memory cell at a low power supply voltage by causing the potential of a bit line during data write to a memory cell to be lower than 0 V (i.e., a negative potential) (see Japanese Unexamined Patent Application Publication No. 2005-071491).

SUMMARY OF THE INVENTION

In the known technique described above, since the bit line potential is controlled so that it is lower than 0 V, i.e., a negative potential, a transistor to which only a potential difference ranging from 0 V to a power supply voltage VDD is conventionally applied suffers from application of a potential difference of the VDD level or higher. Therefore, electrical stress to the transistor is larger than that in the conventional art, so that the reliability of the element is more significantly deteriorated.

Also, another problem arises with respect to a memory cell that is connected to a bit line that has a negative potential and to which data write is not performed during a data write operation. Specifically, the potential of a word line of a memory cell to which data write is not performed is the L level (0 V), however, if the potential of a bit line decreases to a potential that exceeds the threshold voltage of an access transistor included in the memory cell, the access transistor is turned ON, so that data held by the memory cell is destroyed (inversion of data).

Therefore, an object of the present invention is to provide a semiconductor storage device in which the data write characteristic of a memory cell at a low power supply voltage can be improved and a deterioration in reliability of each element can be suppressed, and which has stable write performance.

A semiconductor storage device according to an aspect of the present invention comprises a plurality of word lines, a plurality of bit lines, a plurality of memory cells provided at intersections of the word lines and the bit lines, a precharge circuit connected to the bit lines, and a write circuit connected to the bit lines. The write circuit includes a column selection circuit controlled by a write control signal, a first control circuit for controlling a potential of a selected bit line so that the potential of the selected bit line is a first potential, a second control circuit for controlling the potential of the selected bit line so that the potential of the selected bit line is a second potential that is lower than the first potential, and a clamp circuit for clamping the second potential.

In this case, the clamp circuit may control a voltage applied to each element included in the memory cells, the precharge circuit and the write circuit so that the voltage is a third potential that is higher than the second potential.

Moreover, the clamp circuit may be connected to an output of the second control circuit, and a reduction rate of an L level of the output of the second control circuit may decrease with an increase in a power supply voltage.

Also, the clamp circuit may include one or more diode characteristic elements.

Also, the clamp circuit may include a transistor connected between the output of the second control circuit and a power supply terminal, and an output potential of the second control circuit may be controlled by controlling a gate voltage of the transistor.

Also, one or more switches may be provided and connected in parallel with elements included in the clamp circuit, and an output potential of the second control circuit may be adjusted by a combination of the switches.

Also, the clamp circuit may be disabled when it is not during data write to the memory cells.

Moreover, the clamp circuit may be connected to an input of the second control circuit, and a reduction rate of an H level of the input of the second control circuit may increase with an increase in a power supply voltage.

Also, the clamp circuit may include a transistor connected between the input of the second control circuit and a power supply terminal, and an input potential of the second control circuit may be controlled by controlling a gate voltage of the transistor.

Also, one or more switches may be provided and connected in parallel with elements included in the clamp circuit, and an input potential of the second control circuit may be adjusted by a combination of the switches.

A semiconductor storage device according to another aspect of the present invention comprises a plurality of word lines, a plurality of bit lines, a plurality of memory cells provided at intersections of the word lines and the bit lines, a precharge circuit connected to the bit lines, and a write circuit connected to the bit lines. The write circuit includes a column selection circuit controlled by a write control signal, a first control circuit for controlling a potential of a selected bit line so that the potential of the selected bit line is a first potential, and a second control circuit for controlling the potential of the selected bit line so that the potential of the selected bit line is a second potential that is lower than the first potential. During data write to the memory cells, the second control circuit is driven before a potential of the selected bit line goes to the first potential.

In this case, the second control circuit may be driven at a more higher potential of the bit line than the first potential with an increase in the power supply voltage.

A semiconductor storage device according to still another aspect of the present invention comprises a plurality of word lines, a plurality of bit lines, a plurality of memory cells provided at intersections of the word lines and the bit lines, a precharge circuit connected to the bit lines, and a write circuit connected to the bit lines. The write circuit includes a column selection circuit controlled by a write control signal, a first control circuit for controlling a potential of a selected bit line so that the potential of the selected bit line is a first potential, and a second control circuit for controlling the potential of the selected bit line so that the potential of the selected bit line is a second potential that is lower than the first potential. At least one of a potential applied to the memory cells, a potential applied to the column selection circuit, and a potential output from the precharge circuit is controlled so that the at least one potential is a predetermined potential.

In this case, during data write to the memory cells, a potential of a word line applied to the memory cells may be lower than a power supply voltage.

Also, during data write to the memory cells, a memory cell power supply voltage applied to the memory cells may be lower than a power supply voltage.

Also, during data write to the memory cells, a potential of a write control signal applied to the column selection circuit may be lower than a power supply voltage.

Also, an output potential from the precharge circuit before data write to the memory cells may be lower than a power supply voltage.

Moreover, the precharge circuit includes transistors, and of the transistors, the polarity of a transistor connected to the bit line may be of N channel type.

In the semiconductor storage device of the present invention, a data write characteristic to a memory cell with a low power supply voltage can be improved and a deterioration in reliability of each element can be suppressed, and the semiconductor storage device can have stable write performance and low power consumption.

DETAILED DESCRIPTION OF THE PREFERRED EMBODIMENTS

Hereinafter, embodiments of the present invention will be described with reference to the accompanying drawings. Like parts are indicated by like symbols throughout the specification and will not be repeatedly described.

Embodiment 1 of the Invention

Figure 1:
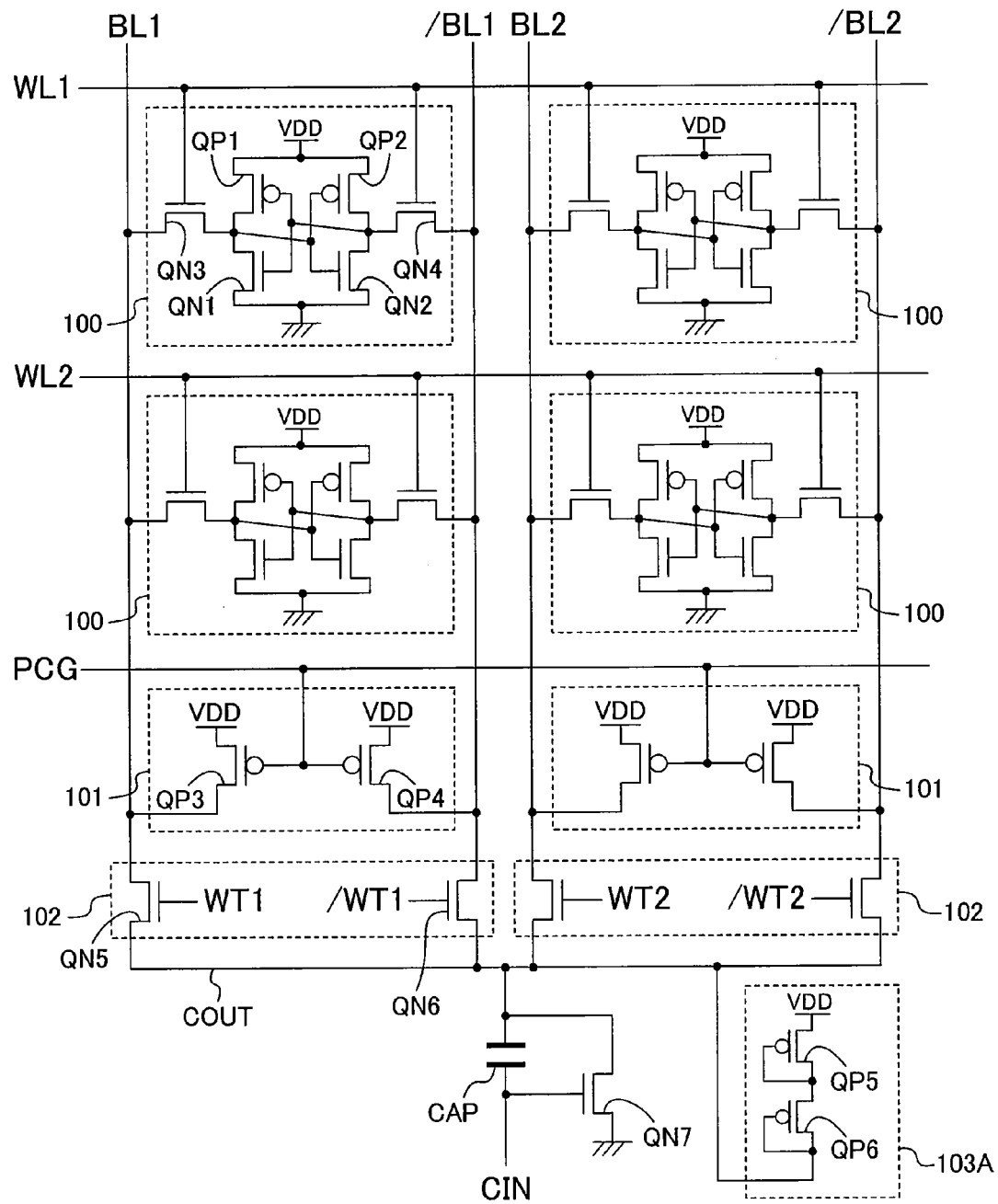
FIG. 1 is a diagram showing a configuration of a semiconductor storage device according to Embodiment 1 of the present invention.

FIG. 1 is a diagram showing a configuration of a semiconductor storage device according to Embodiment 1 of the present invention. The semiconductor storage device of FIG. 1 comprises memory cells 100 each including drive transistors QN1 and QN2, access transistors QN3 and QN4, and load transistors QP1 and QP2, precharge circuits 101 each including P-type MOS transistors QP3 and QP4, column selection circuits 102 each including N-type MOS transistors QN5 and QN6, a clamp circuit 103A including P-type MOS transistors QP5 and QP6, a capacitance element CAP, and an N-type MOS transistor QN7.

The semiconductor storage device of FIG. 1 further comprises word lines WL1 and WL2, bit lines BL1 and BL2 and /BL1 and /BL2, a precharge control signal PCG, write control signals WT1 and WT2 and /WT1 and /WT2, a capacitance element control signal CIN, a capacitance element output node COUT, and a power supply voltage VDD.

In the memory cell 100, the load transistor QP1 and the drive transistor QN1, and the load transistor QP2 and the drive transistor QN2 form respective inverters. The input and output terminals of these inverters are connected so as to form a flip-flop. The flip-flop stores and holds data. The gate terminals of the access transistors QN3 and QN4 are connected to the word line WL1 (WL2), and the drain terminals thereof are connected to the bit lines BL1 and /BL1 (BL2 and /BL2), respectively. The source terminals of the access transistors QN3 and QN4 are connected to the input and output terminals of the inverters.

Data is written into the memory cell 100 by causing the potential of either one of the bit lines BL1 and /BL1 (BL2 and /BL2) precharged to the H level to go from the H level to the L level while the selected word line WL1 (WL2) is caused to go from the L level to the H level (activated state).

In the precharge circuit 101, the P-type MOS transistors QP3 and QP4 are connected between the power supply voltage VDD and the bit lines BL1 and /BL1 (BL2 and /BL2), and the precharge control signal PCG is connected to the gate terminals thereof. In the precharge circuit 101, when the word line WL1 (WL2) is in the non-active state, the precharge control signal PCG is caused to go to the L level so that the P-type MOS transistors QP3 and QP4 are turned ON to precharge the bit lines BL1 and /BL1 (BL2 and /BL2) to the H level. When the word line WL1 (WL2) is in the active state, the precharge control signal PCG is caused to go to the H level so that the P-type MOS transistors QP3 and QP4 are turned OFF, i.e., do not have an influence on the bit lines BL1 and /BL1 (BL2 and /BL2).

In the column selection circuit 102, the N-type MOS transistors QN5 and QN6 are connected between the bit lines BL1 and /BL1 (BL2 and /BL2) and the capacitance element output node COUT, respectively, and the write control signals WT1 and /WT1 (WT2 and /WT2) are connected to the gate terminals of the N-type MOS transistors QN5 and QN6, respectively. The column selection circuit 102 selects the bit lines BL1 and /BL1 (or BL2 and /BL2) and controls which data, H or L, is to be written to the memory cell 100 connected to the selected bit lines.

For example, a case where L-level data is written into the memory cell 100 on the bit lines BL1 and /BL1 that is selected by the word line WL1, will be described. In this case, after the precharge control signal PCG is caused to go to the H level, only the write control signal WT1 is caused to go to the H level (in this case, the other write control signals /WT1, WT2 and /WT2 are at the L level), and then, the word line WL1 is caused to go to the H level, so that L-level data can be written into the write memory cell 100.

In the clamp circuit 103A, the P-type MOS transistors QP5 and QP6 each having a gate terminal in diode connection are connected between the power supply voltage VDD and the capacitance element output node COUT. The capacitance element CAP is connected between the capacitance element output node COUT and the capacitance element control signal CIN. The N-type MOS transistor QN7 is connected between the capacitance element output node COUT and a ground power supply voltage. The capacitance element control signal CIN is connected to the gate terminal of the N-type MOS transistor QN7.

Hereinafter, an operation of the thus-configured semiconductor storage device of this embodiment will be described.

Firstly, a case where the word lines WL1 and WL2 are in the non-active state will be described. In this case, all the word lines WL1 and WL2 are at the L level, and all the memory cells 100 that are controlled by these word lines are in the non-selected state (neither write nor read is performed). Also, the precharge control signal PCG is at the L level, so that the precharge circuits 101 that are controlled by the precharge control signal PCG is in the active state and therefore all the bit lines BL1, /BL1, BL2 and /BL2 are precharged to the H level. Also, all the write control signals WT1, /WT1, WT2 and /WT2 are at the L level, so that all the column selection circuits 102 that are controlled by these write control signals are in the non-active state. Also, the capacitance element control signal CIN is at the H level, so that the N-type MOS transistor QN7 is turned ON to discharge the capacitance element output node COUT to the L level.

In the clamp circuit 103A connected to the capacitance element output node COUT, the two P-type MOS transistors QP5 and QP6 each having a gate terminal in diode connection are connected in series between the power supply voltage VDD and the capacitance element output node COUT. For example, when the threshold voltage of the P-type MOS transistors QP5 and QP6 is −0.6 V and the potential of the capacitance element output node COUT is 0 V, then if the power supply voltage VDD is lower than 1.2 V, the clamp circuit 103A is in the non-active state and therefore does not have an influence on the capacitance element output node COUT. If the power supply voltage VDD becomes higher than 1.2 V, the clamp circuit 103A is activated, so that electric charges flow into the capacitance element output node COUT. In this case, the amount of electric charges flowing into the capacitance element output node COUT increases with an increase in the power supply voltage VDD. The clamp circuit 103A has a characteristic similar to that of a diode element.

Next, an operation in a case where the word line WL1 (or WL2) goes to the active state and data is then written into a memory cell 100, will be described. The precharge control signal PCG goes from the L level to the H level, so that all the precharge circuits 101 that are controlled by the precharge control signal PCG go to the non-active state. For example, the word line WL1 is selected and goes to the H level. Also, for example, the write control signal WT1 is selected and goes to the H level, so that the N-type MOS transistor QN5 in the column selection circuit 102 connected to the bit line BL1 is turned ON and therefore the bit line BL1 and the capacitance element output node COUT are connected to each other via the N-type MOS transistor QN5.

In this case, since the capacitance element control signal CIN is at the H level and the N-type MOS transistor QN7 is ON, electric charges are extracted from the bit line BL1 via the N-type MOS transistor QN7, so that the potential of the bit line BL1 goes to the L level (0 V) after a predetermined time (corresponding to a time T1 in FIG. 9) elapses.

After the potential of the bit line BL1 becomes 0 V, the capacitance element control signal CIN goes from the H level to the L level. Since the capacitance element control signal CIN goes to the L level, the N-type MOS transistor QN7 is turned OFF. Meanwhile, assuming that the capacitance of the capacitance element CAP is Cc, since the capacitance element control signal CIN goes from the H level (VDD) to the L level (0 V), an amount of electric charges corresponding to Cc×VDD are extracted from electric charges in all capacitances (capacitance C1) of the bit line BL1, the capacitance element output node COUT and the storage node (in this case, the source terminal node of the access transistor QN3) of the selected memory cell 100.

Specifically, by division of electric charges by the capacitance Cc and the capacitance C1, the potential of the bit line BL1 or the like is changed from 0 V to −(Cc×VDD)/(Cc+C1), i.e., a negative potential.

Since the potential of the selected bit line becomes a negative potential lower than 0 V, the conductance of the access transistor in the selected memory cell 100 increases. In other words, as compared to a semiconductor storage device in which the potential of a selected bit line does not decrease to less than 0 V, a lower power supply voltage can be used to write data into the memory cell 100. Thus, when the potential of the selected bit line BL1 goes to the L level, data is written into the memory cell 100.

An operation of the clamp circuit 103A connected to the capacitance element output node COUT in this case will be described.

When the clamp circuit 103A is not provided, the absolute value of the negative potential generated by the operation of the capacitance element CAP increases with an increase in the power supply voltage VDD. The dependence of the negative potential (represented by VBB) on the power supply voltage VDD is assumed to have a characteristic VBB=−0.2× VDD. For example, when the power supply voltage VDD is 1.0 V, the negative potential VBB is −0.2 V.

When data is written into a memory cell 100, then if a selected bit line (in this case, BL1), the capacitance element output node COUT, and the storage node of the selected memory cell 100 (in this case, the source terminal of the access transistor QN3) have a negative potential, electrical stress to elements connected to these nodes is obviously larger than in a semiconductor storage device in which the bit line potential does not decrease to less than 0 V.

Also, a non-selected memory cell (e.g., the memory cell 100 connected to the bit line BL1 and the word line WL2) that is connected to a bit line that has a negative potential and to which data write is not performed, has the following problem. Specifically, the potential of the word line WL2 of the non-selected memory cell 100 to which data write is not performed is at the L level (0 V). As the power supply voltage VDD increases, the absolute value of the negative potential of the selected bit line BL1 increases. Therefore, if the negative potential of the selected bit line BL1 decreases to a potential that exceeds the threshold voltage of the access transistor QN3 included in the memory cell 100, the access transistor QN3 is turned ON, so that data held by the memory cell is destroyed (data inversion).

To avoid this, when data is written into a memory cell 100, then only if the power supply voltage VDD is low, the potential of a selected bit line may be caused to be negative so that the conductance of the access transistor in the selected memory cell 100 is increased, whereby data can be easily written. When the power supply voltage VDD is high, data can be written into the memory cell 100 without causing the potential of the selected bit line to be negative. This is because, if each node is caused to be at a negative potential, then particularly when the power supply voltage VDD is high, excessively large electrical stress is applied to elements connected to the nodes having the negative potential, so that the reliability of the element is deteriorated and data held by a non-selected memory cell connected to a selected bit line is destroyed.

Figure 9:
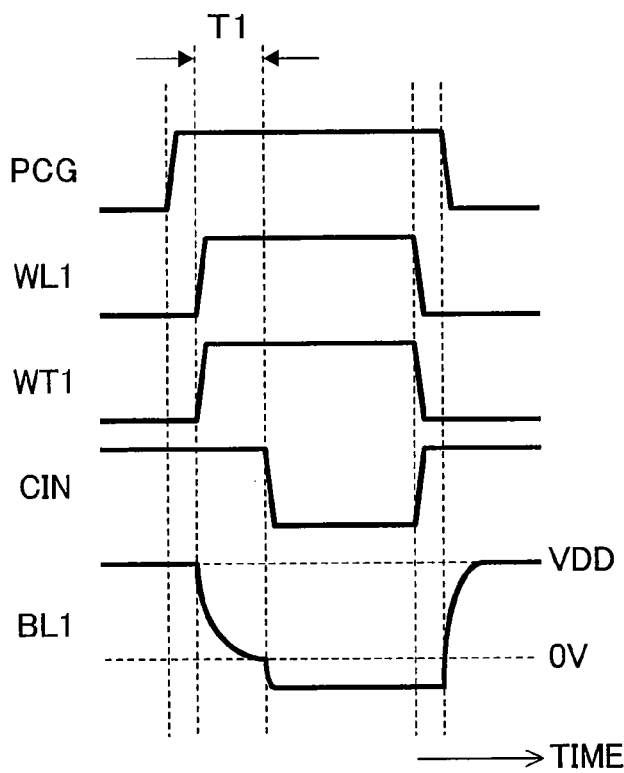
FIG. 9 is a timing chart showing an operation of a conventional semiconductor storage device.

A timing chart showing an operation when the clamp circuit 103A is not provided in the configuration of FIG. 1 (conventional semiconductor storage device) is shown in FIG. 9.

Next, a case where the clamp circuit 103A is provided will be described. The threshold voltage of the P-type MOS transistors QP5 and QP6 is −0.6 V, and the power supply voltage dependence of the negative potential VBB generated by an operation of capacitance element CAP is VBB=−0.2×VDD.

When the power supply voltage VDD is lower than 1.0 V, the clamp circuit 103A is in the non-active state and does not have an influence on the capacitance element output node COUT. When the power supply voltage VDD becomes higher than 1.0 V, the clamp circuit 103A is activated, so that electric charges flow into the capacitance element output node COUT. Therefore, as the power supply voltage VDD increases after exceeding 1.0 V, the negative potential VBB is controlled so that it is higher than when the clamp circuit 103A is not provided.

After data write to the memory cell 100 is completed, the word line WL1 goes from the H level to the L level, so that all the memory cells 100 go into the non-selected state. Also, the write control signal WT1 goes from the H level to the L level, so that all the column selection circuits 102 go into the non-active state. Further, the capacitance element control signal CIN goes from the L level to the H level, so that the N-type MOS transistor QN7 is turned ON and therefore the capacitance element output node COUT is discharged to the L level. Thereafter, the precharge control signal PCG goes from the H level to the L level, so that all the precharge circuits 101 go into the active state and therefore all the bit lines are precharged to the H level.

As described above, with the configuration of the present invention of FIG. 1, when the power supply voltage VDD is low, a data write characteristic to the memory cell 100 can be improved as in the conventional art. Further, when the power supply voltage VDD is high, the potential of a selected bit line or the like during a data write operation to a memory cell 100 can be controlled so that it is higher than that in the conventional art. Therefore, electrical stress applied to elements connected to a selected bit line or the like can be reduced, thereby making it possible to suppress a deterioration in reliability. Also, it is possible to prevent destruction of data held by a non-selected memory cell connected to a selected bit line.

Note that the operation power supply voltage of the semiconductor storage device, the threshold voltage of a transistor in the semiconductor storage device, and the like vary depending on the operation power supply voltage specifications, process conditions and the like of the semiconductor storage device. It has been assumed in this embodiment that the threshold voltage of the P-type MOS transistors QP5 and QP6 included in the clamp circuit 103A is −0.6 V and the power supply voltage VDD at which operations are switched (border voltage) is 1.0 V.

When the transistor threshold voltage or the border voltage at which operations are switched have other values, the clamp circuit 103A may include only one P-type MOS transistor or a plurality of P-type MOS transistors connected in series (e.g., three P-type MOS transistors connected in series), for example. Also, instead of a P-type MOS transistor, an N-type MOS transistor having a gate terminal in diode connection or a PN-junction diode may be used. Also, the P-type MOS transistor, the N-type MOS transistor, the PN-junction diode, a resistance element, and the like may be used in combination. In other words, the configuration of the clamp circuit 103A may be changed, depending on operation conditions required for the semiconductor storage device.

Figure 2:
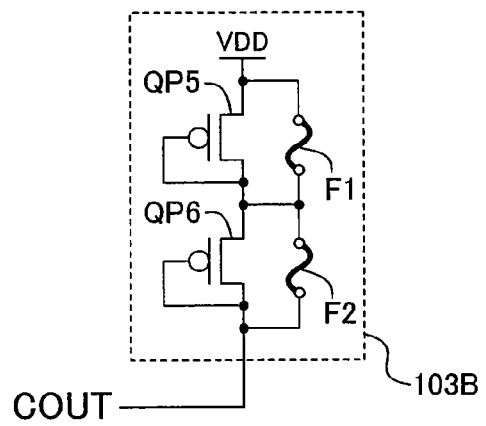
FIG. 2 is a diagram showing a specific configuration of a clamp circuit included in the semiconductor storage device of Embodiment 1.

FIG. 2 is a diagram showing another example of the clamp circuit 103A of FIG. 1. The clamp circuit 103B of FIG. 2 includes fuse elements F1 and F2 connected in parallel with the P-type MOS transistors QP5 and QP6 of the clamp circuit 103A of FIG. 1.

If the fuse elements F1 and F2 are connected in parallel with the transistors QP5 and QP6 as in the configuration of FIG. 2, the border voltage at which operations are switched can be changed to any voltage, depending on operation conditions required for the semiconductor storage device, by cutting one of the fuse elements.

FIG. 2 shows an example in which the fuse elements F1 and F2 are used as means for switching set voltages. Instead of these fuse elements, the source terminal and the drain terminal of a transistor may be connected in parallel and the gate terminal of the transistor may be ON/OFF controlled, thereby achieving an operation and an effect similar to those when fuse elements are used.

Figure 3:
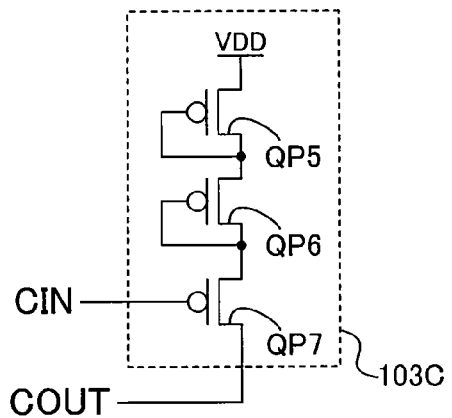
FIG. 3 is a diagram showing another specific configuration of a clamp circuit included in the semiconductor storage device of Embodiment 1.

FIG. 3 is a diagram showing another example of the clamp circuit 103A of FIG. 1. In a clamp circuit 103C of FIG. 3, another P-type MOS transistor QP7 is connected in series between the P-type MOS transistor QP6 included in the clamp circuit 103A of FIG. 1 and the capacitance element output node COUT, and the gate terminal of the P-type MOS transistor QP7 is connected to the capacitance element control signal CIN.

The clamp circuit may be activated only during a write operation. In the case of the clamp circuit 103A of FIG. 1, when it is not during a write operation, i.e., a word line is in the non-active state, the capacitance element control signal CIN is at the H level, so that the N-type MOS transistor QN7 is turned ON and therefore the capacitance element output node COUT is discharged to the L level. In this case, whereas the clamp circuit 103A is in the non-active state when the power supply voltage VDD is low (lower than 1.2 V), the clamp circuit 103A is activated when the power supply voltage VDD becomes high (exceeds 1.2 V), so that a stationary current flows from the clamp circuit 103A via the N-Type MOS transistor QN7.

To avoid this, as in the clamp circuit 103C of FIG. 3, another P-type MOS transistor QP7 is connected in series between the P-type MOS transistor QP6 and the capacitance element output node COUT, so that when a word line is in the non-active state, the capacitance element control signal CIN is at the H level and therefore the P-type MOS transistor QP7 can be turned OFF. Thereby, the clamp circuit 103C is activated only during a write operation, and is in the non-active state when it is not during a write operation, so that a stationary current that would otherwise flow when it is not during a write operation can be eliminated, resulting in lower power consumption. The configuration of FIG. 3 is applicable to the configuration of FIG. 2.

Figure 4:
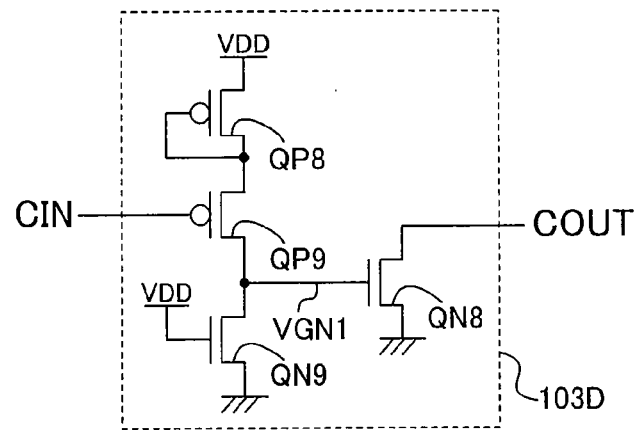
FIG. 4 is a diagram showing still another specific configuration of a clamp circuit included in the semiconductor storage device of Embodiment 1.

FIG. 4 is a diagram showing another example of the clamp circuit 103A of FIG. 1. In a clamp circuit 103D of FIG. 4, a P-type MOS transistor QP8 having a gate terminal in diode connection, a P-type MOS transistor QP9 having a gate terminal connected to the capacitance element control signal CIN, and an N-type MOS transistor QN9 having a gate terminal connected to the power supply voltage VDD are connected in series between the power supply voltage VDD and a ground power supply voltage. An intersection of the drain terminal of the P-type MOS transistor QP9 and the drain terminal of the N-type MOS transistor QN9 is referred to as a gate control node VGN1. The gate control node VGN1 is connected to the gate terminal of an N-type MOS transistor QN8 connected between the capacitance element output node COUT and the ground power supply voltage.

In the clamp circuit 103D, when it is not during a Write operation (a word line is in the non-active state), the capacitance element control signal CIN is at the H level, so that the P-type MOS transistor QP9 is OFF and therefore the gate control node VGN1 invariably outputs the L level by the N-type MOS transistor QN9 whose gate terminal is at the power supply voltage VDD. Therefore, the N-type MOS transistor QN8 that receives the gate control node VGN1 at the gate terminal thereof is invariably OFF and therefore does not have an influence on the capacitance element output node COUT.

An operation of the clamp circuit 103D when a word line is in the active state will be described. When the word line is in the active state and the capacitance element control signal CIN goes from the H level to the L level, the P-type MOS transistor QP9 that receives the capacitance element control signal CIN at the gate terminal thereof is turned ON.

It is here assumed that the threshold voltage of a P-type MOS transistor is VTP=−0.6 V and the threshold voltage of an N-type MOS transistor is VTN=0.6 V. The power supply voltage dependence of the gate control node VGN1 is assumed to have substantially a characteristic VGN1=VDD−|VTP| due to the P-type MOS transistor QP8 having a gate terminal in diode connection and the N-type MOS transistor QN9 having a gate terminal connected to the power supply voltage VDD. As also described with respect to the configuration of FIG. 1, it is assumed that as the power supply voltage VDD increases, the absolute value of the negative potential VBB generated by an operation of the capacitance element CAP also increases, so that the power supply voltage dependence of the negative potential VBB has a characteristic represented by VBB=−0.2×VDD.

When the power supply voltage VDD is 1.0 V, the gate control node VGN1=0.4 V and the negative potential VBB=−0.2 V. Therefore, since the threshold voltage VTN of the N-type MOS transistor QN8 is 0.6 V, the N-type MOS transistor QN8 is turned ON, so that electric charges are supplied from the ground power supply voltage to the negative potential VBB.

Specifically, when the power supply voltage VDD is lower than 1.0 V, the clamp circuit 103D is in the non-active state and does not have an influence on the capacitance element output node COUT. When the power supply voltage VDD becomes higher than 1.0 V, the clamp circuit 103D is activated, so that electric charges flow into the capacitance element output node COUT. Therefore, as the power supply voltage VDD increases after exceeding 1.0 V, the negative potential is controlled so that it is higher than when the clamp circuit 103D is not provided.

The configuration of the clamp circuit 103D of FIG. 4 in which the voltage of the gate terminal of the transistor QN8 connected between the capacitance element output node COUT and the ground power supply voltage is controlled, can also achieve an operation and an effect similar to those of FIG. 1.

The P-type MOS transistor QP9 in the clamp circuit 103D of FIG. 4 may not be provided in terms of an operation. However, when it is not during a write operation and the capacitance element control signal CIN is at the H level, the P-type MOS transistor QP9 is turned OFF, so that a stationary current does not flow from the power supply voltage VDD via the N-type MOS transistor QN9 to the ground power supply voltage, thereby making it possible to achieve lower power consumption.

Note that, in the clamp circuit 103D of FIG. 4, the N-type MOS transistor QN8 is connected between the capacitance element output node COUT and a ground power supply voltage. Instead of this, a P-type MOS transistor may be connected between the power supply voltage VDD and the capacitance element output node COUT and the voltage of the gate terminal of the P-type MOS transistor may be controlled. Also in this case, a similar effect is obtained.

The operation power supply voltage of a semiconductor storage device, the threshold voltage of a transistor in a semiconductor storage device, and the like vary depending on the operation power supply voltage specifications, process conditions or the like of the semiconductor storage device. For example, two or more P-type MOS transistors QP8 each having a gate terminal in diode connection may be connected in series in the clamp circuit 103D, or alternatively, instead of a P-type MOS transistor, an N-type MOS transistor having a gate terminal in diode connection or a PN-junction diode element may be used. Alternatively, a P-type MOS transistor, an N-type MOS transistor, a PN-junction diode, a resistance element and the like may be used in combination.

Moreover, the fuse elements F1 and F2 of FIG. 2 may be connected in parallel with a transistor, or alternatively, instead of these fuse elements, a transistor may be connected in parallel and the gate terminal of the transistor may be ON/OFF controlled. In other words, the configuration of the clamp circuit 103D may be changed, depending on operation conditions required for the semiconductor storage device.

Embodiment 2 of the Invention

Figure 5:
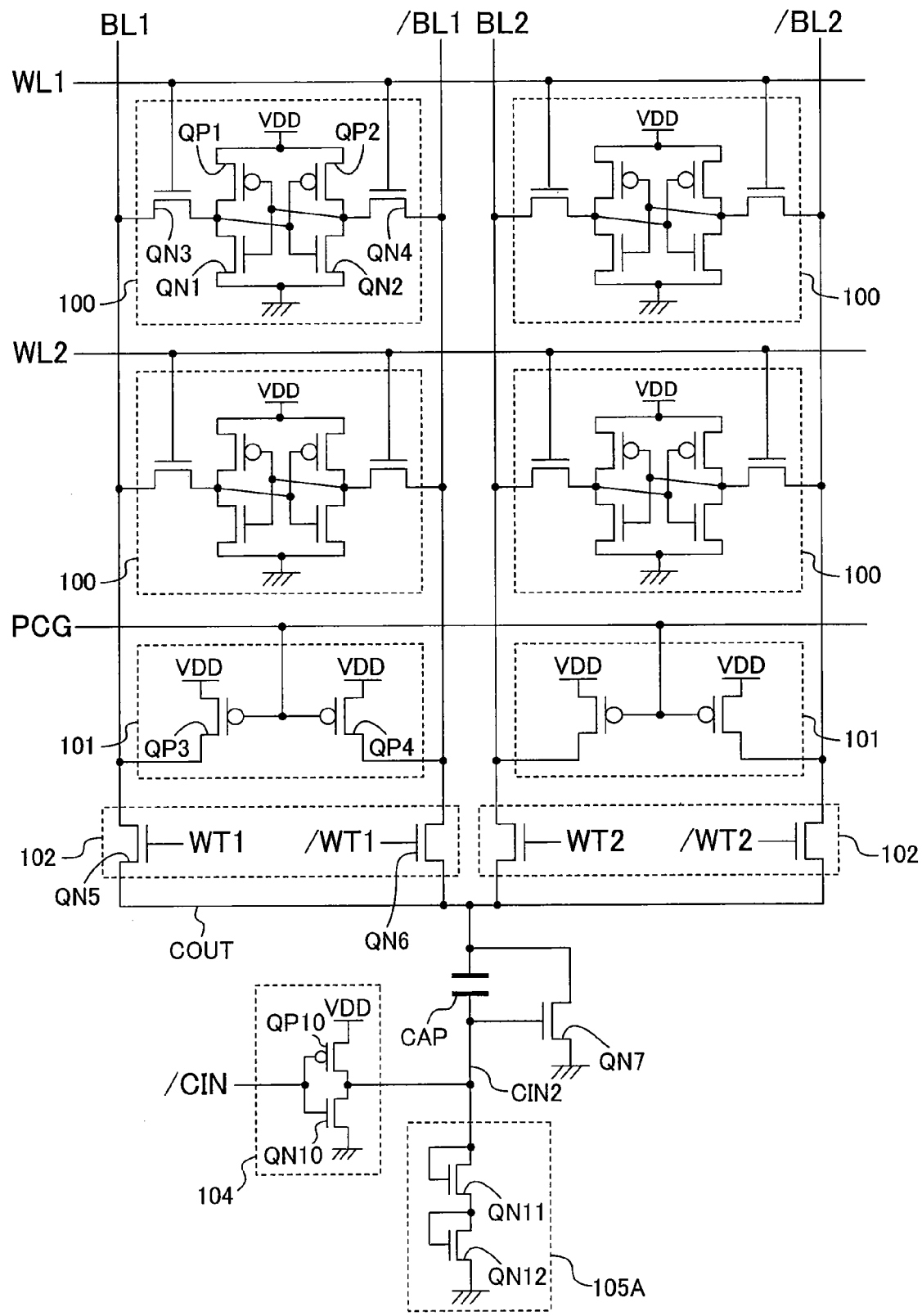
FIG. 5 is a diagram showing a configuration of a semiconductor storage device according to Embodiment 2 of the present invention.

FIG. 5 is a diagram showing a configuration of a semiconductor storage device according to Embodiment 2 of the present invention. The semiconductor storage device of FIG. 5 comprises memory cells 100 each including drive transistors QN1 and QN2, access transistors QN3 and QN4, and load transistors QP1 and QP2, precharge circuits 101 each including P-type MOS transistors QP3 and QP4, column selection circuits 102 each including N-type MOS transistors QN5 and QN6, a capacitance element CAP, an N-type MOS transistor QN7, an inverter 104 including a P-type MOS transistor QP10 and an N-type transistor QN10, and a clamp circuit 105A including N-type MOS transistors QN11 and QN12.

The semiconductor storage device of FIG. 5 further comprises word lines WL1 and WL2, bit lines BL1 and BL2 and /BL1 and /BL2, a precharge control signal PCG, write control signals WT1 and WT2 and /WT1 and /WT2, a capacitance element control signal /CIN (an inversion of the capacitance element control signal CIN of Embodiment 1 of the present invention), a capacitance element output node COUT, a capacitance element input node CIN2, and a power supply voltage VDD.

The memory cell 100, the precharge circuit 101, the column selection circuit 102, the capacitance element CAP, and the N-type MOS transistor QN7 are the same as those of Embodiment 1 of the present invention and will not be described.

In the inverter 104, the P-type MOS transistor QP10 and the N-type MOS transistor QN10 are connected in series between the power supply voltage VDD and a ground power supply voltage. The inverter 104 outputs an inversion of the capacitance element control signal /CIN to the capacitance element input node CIN2.

In the clamp circuit 105A, the N-type MOS transistors QN11 and QN12 each having a gate terminal in diode connection are connected between the capacitance element input node CIN2 and the ground power supply voltage.

Hereinafter, an operation of the thus-configured semiconductor storage device of this embodiment will be described.

Firstly, a case where the word lines WL1 and WL2 are in the non-active state will be described. In this case, all the word lines WL1 and WL2 are at the L level, and all the memory cells 100 that are controlled by these word lines are in the non-selected state (neither write nor read is performed). Also, the precharge control signal PCG is at the L level, so that the precharge circuits 101 that are controlled by the precharge control signal PCG is in the active state and therefore all the bit lines BL1, /BL1, BL2 and /BL2 are precharged to the H level. Also, all the write control signals WT1, /WT1, WT2 and /WT2 are at the L level, so that all the column selection circuits 102 that controlled by these write control signals are in the non-active state. Also, the capacitance element control signal /CIN is at the L level, so that the capacitance element input node CIN2 is caused to go to the H level by the inverter 104 and therefore the N-type MOS transistor QN7 is turned ON to discharge the capacitance element output node COUT to the L level.

In the clamp circuit 105A connected to the capacitance element input node CIN2, the two N-type MOS transistors QN11 and QN12 having gate terminals in diode connection are connected in series between the capacitance element input node CIN2 and the ground power supply voltage. For example, when the threshold voltage of the N-type MOS transistors QN11 and QN12 is 0.6 V, then if the potential of the capacitance element input node CIN2 is lower than 1.2 V, the clamp circuit 105A is in the non-active state and therefore does not have an influence on the capacitance element input node CIN2. If the potential of the capacitance element input node CIN2 becomes higher than 1.2 V, the clamp circuit 105A is activated, so that electric charges of the capacitance element input node CIN2 flow into the ground power supply voltage. In this case, the amount of electric charges flow into the ground power supply voltage increases with an increase in the power supply voltage VDD. The clamp circuit 105A has a characteristic similar to that of a diode element.

Next, an operation in a case where the word line WL1 (or WL2) goes to the active state and data is then written into a memory cell 100, will be described. The precharge control signal PCG goes from the L level to the H level, so that all the precharge circuits 101 that are controlled by the precharge control signal PCG go to the non-active state. For example, the word line WL1 is selected and goes to the H level. Also, for example, the write control signal WT1 is selected and goes to the H level, so that the N-type MOS transistor QN5 in the column selection circuit 102 connected to the bit line BL1 is turned ON and therefore the bit line BL1 and the capacitance element output node COUT are connected to each other via the N-type MOS transistor QN5.

In this case, since the capacitance element control signal /CIN is at the L level and the capacitance element input node CIN2 is at the H level and therefore the N-type MOS transistor QN7 is ON, electric charges are extracted from the bit line BL1 via the N-type MOS transistor QN7, so that the potential of the bit line BL1 goes to the L level (0 V) after a predetermined time (corresponding to the time T1 in FIG. 9) elapses.

After the potential of the bit line BL1 becomes 0 V, the capacitance element control signal /CIN goes from the L level to the H level. Since the capacitance element control signal /CIN goes to the H level, the capacitance element input node CIN2 goes to the L level, so that the N-type MOS transistor QN7 is turned OFF. Meanwhile, assuming that the capacitance of the capacitance element CAP is Cc and the H-level voltage of the capacitance element input node CIN2 is VCH, when the capacitance element input node CIN2 goes from the H level (VCH) to the L level (0 V), an amount of electric charges corresponding to Cc×VCH are extracted from electric charges in all capacitances (capacitance C1) of the bit line BL1, the capacitance element output node COUT and the storage node (in this case, the source terminal node of the access transistor QN3) of the selected memory cell 100.

Specifically, by division of electric charges by the capacitance Cc and the capacitance C1, the potential of the bit line BL1 or the like is changed from 0 V to −(Cc×VCH)/(Cc+C1), i.e., a negative potential.

Since the potential of the selected bit line becomes a negative potential lower than 0 V, the conductance of the access transistor in the selected memory cell 100 increases. In other words, as compared to a semiconductor storage device in which the potential of the selected bit line does not decrease to less than 0 V, a lower power supply voltage can be used to write data into the memory cell 100. Thus, when the potential of the selected bit line BL1 goes to the L level, data is written into the memory cell 100.

An operation of the clamp circuit 105A connected to the capacitance element input node CIN2 in this case will be described.

When the clamp circuit 105A is not provided, the absolute value of the negative potential generated by the operation of the capacitance element CAP increases with an increase in the power supply voltage VDD. In this case, the H-level potential VCH of the capacitance element input node CIN2 is equal to the power supply voltage VDD. The dependence of the negative potential (represented by VBB) on the power supply voltage VDD is assumed to have a characteristic VBB=−0.2×VDD.

When data is written into a memory cell 100, then if a selected bit line (in this case, BL1), the capacitance element output node COUT, and the storage node of the selected memory cell 100 (in this case, the source terminal of the access transistor QN3) have a negative potential, electrical stress to elements connected to these nodes having a negative potential is obviously larger than in a semiconductor storage device in which the bit line potential does not decrease to less than 0 V.

Also, a non-selected memory cell (e.g., the memory cell 100 connected to the bit line BL1 and the word line WL2) that is connected to a bit line that has a negative potential and in which data write is not performed, has the following problem. Specifically, the potential of the word line WL2 of the non-selected memory cell 100 in which data write is not performed is at the L level (0 V). As the power supply voltage VDD increases, the absolute value of the negative potential of the selected bit line BL1 increases. Therefore, if the negative potential of the selected bit line BL1 decreases to a potential that exceeds the threshold voltage of the access transistor QN3 included in the memory cell 100, the access transistor QN3 is turned ON, so that data held by the memory cell is destroyed (data inversion).

To avoid this, when data is written into a memory cell 100, the potential of a selected bit line may be caused to be negative so that the conductance of the access transistor in the selected memory cell 100 is increased, whereby data can be easily written, only if the power supply voltage is low. When the power supply voltage VDD is high, data can be written into the memory cell 100 without causing the potential of the selected bit line to be negative. This is because, if each node is caused to have a negative potential, then particularly when the power supply voltage VDD is high, excessively large electrical stress is applied to elements connected to the nodes having a negative potential, so that the reliability of the element is deteriorated and data held by a non-selected memory cell connected to a selected bit line is destroyed.

Next, a case where the clamp circuit 105A is provided will be described. The threshold voltage of the N-type MOS transistors QN11 and QN12 is 0.6 V, and the power supply voltage dependence of the negative potential VBB generated by an operation of capacitance element CAP is VBB=−0.2×VCH.

When the power supply voltage VDD is lower than 1.2 V, the clamp circuit 105A is in the non-active state. Therefore, the H-level potential VCH of the capacitance element input node CIN2 is equal to the power supply voltage VDD, and the negative voltage VBB generated at the capacitance element output node COUT is equal to a potential when the clamp circuit 105A is not provided (VBB=−0.2×VDD).

When the power supply voltage VDD becomes higher than 1.2 V, the clamp circuit 105A is activated, so that the H-level potential VCH of the capacitance element input node CIN2 becomes a potential that is determined by a ratio of drive performance between the P-type MOS transistor OP10 and the clamp circuit 105A. When the power supply voltage VDD is higher than 1.2 V, then if the H-level potential VCH of the capacitance element input node CIN2 has, for example, substantially a characteristic VCH=2VTN, the H-level potential VCH of the capacitance element input node CIN2 decreases from the power supply voltage VDD with an increase in the power supply voltage VDD after exceeding 1.2 V.

Therefore, the negative potential VBB generated by an operation of the capacitance element CAP is VBB=−0.2×2VTN. Thus, the absolute value of the negative potential VBB is not high even if the power supply voltage VDD is high.

After data write to the memory cell 100 is completed, the word line WL1 goes from the H level to the L level, and all the memory cells 100 go into the non-selected state. Also, the write control signal WT1 goes from the H level to the L level, so that all the column selection circuits 102 go into the non-active state. Further, the capacitance element control signal /CIN goes from the H level to the L level and then the capacitance element input node CIN2 goes to the H level, so that the N-type MOS transistor QN7 is turned ON and therefore the capacitance element output node COUT is discharged to the L level. Thereafter, the precharge control signal PCG goes from the H level to the L level, so that all the precharge circuits 101 go into the active state and therefore all the bit lines are precharged to the H level.

As described above, with the configuration of the present invention of FIG. 5, when the power supply voltage VDD is low, a data write characteristic to the memory cell 100 can be improved as in the conventional art. Further, when the power supply voltage VDD is high, the potential of a selected bit line or the like during a data write operation to a memory cell 100 can be controlled so that it is higher than that in the conventional art. Therefore, electrical stress applied to elements connected to a selected bit line or the like can be reduced, thereby making it possible to suppress a deterioration in reliability. Also, it is possible to prevent destruction of data held by a non-selected memory cell connected to a selected bit line.

Note that the operation power supply voltage of the semiconductor storage device, the threshold voltage of a transistor in the semiconductor storage device, and the like vary depending on the operation power supply voltage specifications, process conditions and the like of the semiconductor storage device. It has been assumed in this embodiment that the threshold voltage of the N-type MOS transistors QN11 and QN12 included in the clamp circuit 105A is 0.6 V and the power supply voltage VDD at which operations are switched (border voltage) is 1.2 V.

When the transistor threshold voltage or the border voltage at which operations are switched have other values, the clamp circuit 105A may include only one N-type MOS transistor or a plurality of N-type MOS transistors connected in series (e.g., three N-type MOS transistors connected in series), for example. Also, instead of an N-type MOS transistor, a P-type MOS transistor having a gate terminal in diode connection or a PN-junction diode may be used. Also, the P-type MOS transistor, the N-type MOS transistor, the PN-junction diode, a resistance element, and the like may be used in combination. In other words, the configuration of the clamp circuit 105A may be changed, depending on operation conditions required for the semiconductor storage device.

Figure 6:
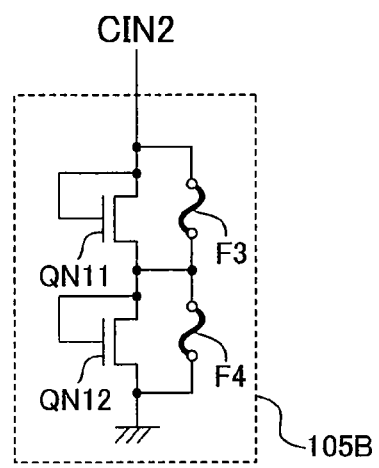
FIG. 6 is a diagram showing a specific configuration of a clamp circuit included in the semiconductor storage device of Embodiment 2.

FIG. 6 is a diagram showing another example of the clamp circuit 105A of FIG. 5. The clamp circuit 105B of FIG. 6 further includes fuse elements F3 and F4 connected in parallel with the N-type MOS transistors QN11 and QN12 of the clamp circuit 105A of FIG. 5.

If the fuse elements F3 and F4 are connected in parallel with the transistors QN11 and QN12 as in the configuration of FIG. 6, the border voltage at which operations are switched can be changed to any voltage, depending on operation conditions required for the semiconductor storage device, by cutting one of the fuse elements.

FIG. 6 shows an example in which the fuse elements F3 and F4 are used as means for switching set voltages. Instead of these fuse elements, the source terminal and the drain terminal of a transistor may be connected in parallel and the gate terminal of the transistor may be ON/OFF controlled, thereby achieving an operation and an effect similar to those when fuse elements are used.

Figure 7:
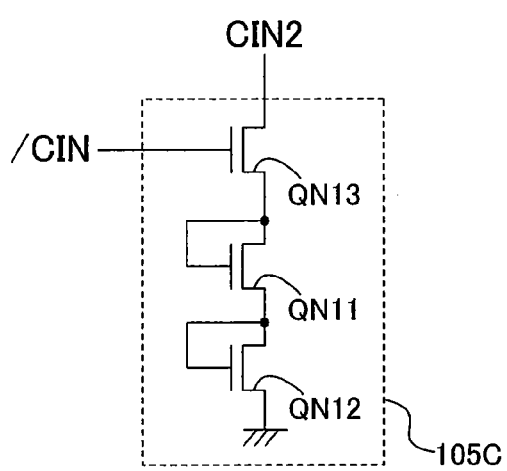
FIG. 7 is a diagram showing another specific configuration of a clamp circuit included in the semiconductor storage device of Embodiment 2.

FIG. 7 is a diagram showing another example of the clamp circuit 105A of FIG. 5. In a clamp circuit 105C of FIG. 7, another N-type MOS transistor QN13 is connected in series between the N-type MOS transistor QN11 included in the clamp circuit 105A of FIG. 5 and the capacitance element input node CIN2, and the gate terminal of the N-type MOS transistor QN13 is connected to the capacitance element control signal /CIN.

The clamp circuit may be activated only during a write operation. In the case of the clamp circuit 105A of FIG. 5, when it is not during a write operation, i.e., a word line is in the non-active state, the capacitance element control signal /CIN is at the L level and therefore the capacitance element input node CIN2 is at the H level, so that the N-type MOS transistor QN7 is turned ON and therefore the capacitance element output node COUT is discharged to the L level. In this case, whereas the clamp circuit 105A is in the non-active state when the power supply voltage VDD is low (lower than 1.2 V), the clamp circuit 105A is activated when the power supply voltage VDD becomes high (exceeds 1.2 V), so that a stationary current flows from the P-type MOS transistor QP10 via the clamp circuit 105A.

To avoid this, as in the clamp circuit 105C of FIG. 7, another N-type MOS transistor QN13 is connected in series between the N-type MOS transistor QN11 and the capacitance element input node CIN2, so that when a word line is in the non-active state, the capacitance element control signal /CIN is at the L level and therefore the N-type MOS transistor QN13 can be turned OFF. Thereby, the clamp circuit 105C is activated only during a write operation, and is in the non-active state when it is not during a write operation, so that a stationary current that would otherwise flow when it is not during a write operation can be eliminated, resulting in lower power consumption. The configuration of FIG. 7 is applicable to the configuration of FIG. 6.

Figure 8:
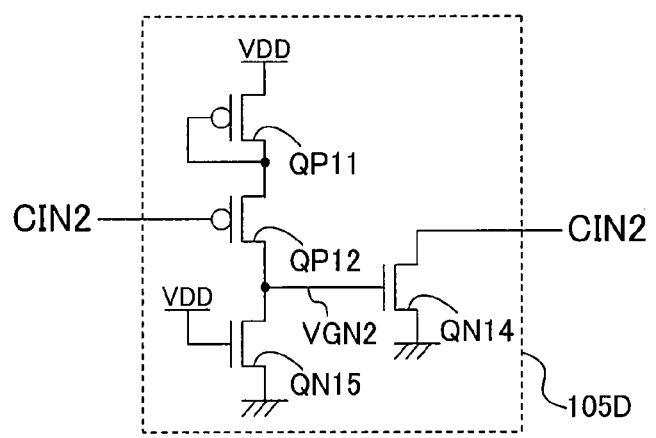
FIG. 8 is a diagram showing still another specific configuration of a clamp circuit included in the semiconductor storage device of Embodiment 2.

FIG. 8 is a diagram showing another example of the clamp circuit 105A of FIG. 5. In a clamp circuit 105D of FIG. 8, a P-type MOS transistor QP11 having a gate terminal in diode connection, a P-type MOS transistor QP12 having a gate terminal connected to the capacitance element input node CIN2, and an N-type MOS transistor QN15 having a gate terminal connected to the power supply voltage VDD are connected in series between the power supply voltage VDD and a ground power supply voltage. An intersection of the drain terminal of the P-type MOS transistor QP12 and the drain terminal of the N-type MOS transistor QN15 is referred to as a gate control node VGN2. The gate control node VGN2 is connected to the gate terminal of an N-type MOS transistor QN14 connected between the capacitance element input node CIN2 and the ground power supply voltage.

In the clamp circuit 105D, when it is not during a write operation (a word line is in the non-active state), the capacitance element control signal /CIN is at the L level, so that the P-type MOS transistor QP12 is OFF and therefore the gate control node VGN2 invariably outputs the L level by the N-type MOS transistor QN15 whose gate terminal is at the power supply voltage VDD. Therefore, the N-type MOS transistor QN14 that receives the gate control node VGN2 at the gate terminal thereof is invariably OFF and therefore does not have an influence on the capacitance element input node CIN2.

An operation of the clamp circuit 105D when a word line is in the active state will be described. When the word line is in the active state, then if the capacitance element control signal /CIN goes from the L level to the H level, the capacitance element input node CIN2 goes from the H level to the L level, so that the P-type MOS transistor QP12 that receives the capacitance element input node CIN2 at the gate terminal thereof is turned ON.

It is here assumed that the threshold voltage of a P-type MOS transistor is VTP=−0.6 V and the threshold voltage of an N-type MOS transistor is VTN=0.6 V. The power supply voltage dependence of the gate control node VGN2 is assumed to have substantially a characteristic VGN2=VDD−|VTP| due to the P-type MOS transistor QP11 having a gate terminal in diode connection and the N-type MOS transistor QN15 having a gate terminal connected to the power supply voltage VDD. As also described with respect to the configuration of FIG. 5, it is assumed that the power supply voltage dependence of the negative potential VBB generated by an operation of the capacitance element CAP has a characteristic represented by VBB=−0.2×VCH, where VCH is the H-level potential of the capacitance element input node CIN2.

When the power supply voltage VDD is lower than 1.2 V, the gate control node VGN2 is lower than 0.6 V, so that the N-type MOS transistor QN14 that receives the gate control node VGN2 at the gate terminal thereof is in the non-active state and does not have an influence on the capacitance element input node CIN2. Therefore, the H-level potential VCH of the capacitance element input node CIN2 is equal to the power supply voltage VDD, and the negative potential VBB generated at the capacitance element output node COUT is equal to a potential when the clamp circuit 105D is not provided (VBB=−0.2×VDD).

When the power supply voltage VDD becomes higher than 1.2 V, the gate control node VGN2 becomes higher than 0.6 V, so that the N-type MOS transistor QN14 that receives the gate control node VGN2 at the gate terminal thereof goes into the active state. Therefore, the H-level potential VCH of the capacitance element input node CIN2 is determined based on a ratio of drive performance between the P-type MOS transistor QP10 and the N-type MOS transistor QN14. Therefore, the power supply voltage dependence of the H-level potential VCH of the capacitance element input node CIN2 has a characteristic such that the H-level potential has a value lower than that of the power supply voltage VDD. Therefore, when the power supply voltage VDD is higher than 1.2 V, the negative potential VBB generated by an operation of the capacitance element CAP (VBB=−0.2×VCH) is controlled so that it is higher than when the clamp circuit 105D is not provided.

The configuration of the clamp circuit 105D of FIG. 8 in which the voltage of the gate terminal of the transistor QN14 connected between the capacitance element input node CIN2 and the ground power supply voltage is controlled, can also achieve an operation and an effect similar to those of FIG. 5.

The P-type MOS transistor QP12 in the clamp circuit 105D of FIG. 8 may not be provided in terms of an operation. However, when it is not during a write operation and the capacitance element control signal /CIN is at the L level and therefore the capacitance element input node CIN2 is at the H level, the P-type MOS transistor QP12 is turned OFF, so that a stationary current does not flow from the power supply voltage VDD via the N-type MOS transistor QN15 to the ground power supply voltage, thereby making it possible to achieve lower power consumption.

Note that the operation power supply voltage of a semiconductor storage device, the threshold voltage of a transistor in a semiconductor storage device, and the like vary depending on the operation power supply voltage specifications, process conditions or the like of the semiconductor storage device. For example, two or more P-type MOS transistors QP11 each having a gate terminal in diode connection may be connected in series in the clamp circuit 105D, or alternatively, instead of a P-type MOS transistor, an N-type MOS transistor having a gate terminal in diode connection or a PN-junction diode element may be used. Alternatively, a P-type MOS transistor, an N-type MOS transistor, a PN-junction diode, a resistance element and the like may be used in combination.

Moreover, the fuse elements F3 and F4 of FIG. 6 may be connected in parallel with a transistor, or alternatively, instead of these fuse elements, a transistor may be connected in parallel and the gate terminal of the transistor may be ON/OFF controlled. In other words, the configuration of the clamp circuit 105D may be changed, depending on operation conditions required for the semiconductor storage device.

Embodiment 3 of the Invention

Figure 10:
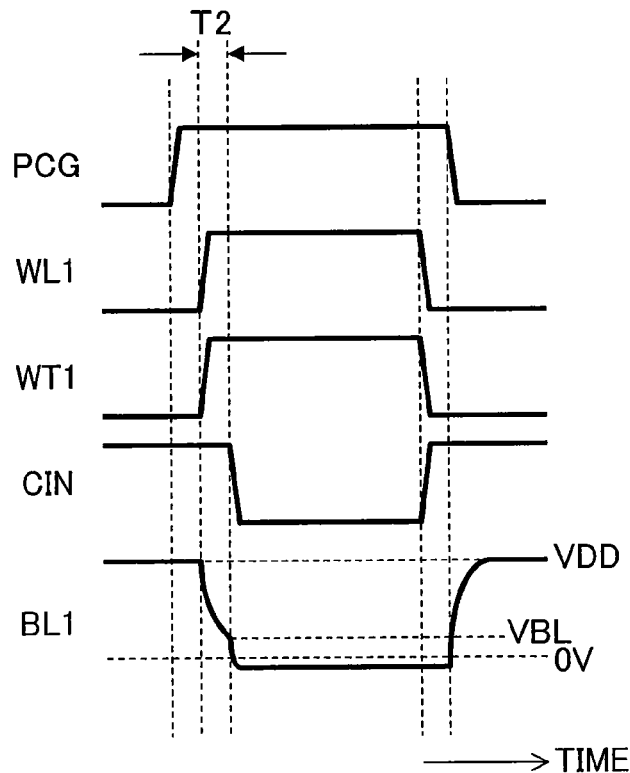
FIG. 10 is a timing chart showing an operation of a semiconductor storage device according to Embodiment 3 of the present invention.

FIG. 10 is a timing chart showing an operation of a semiconductor storage device according to Embodiment 3 of the present invention. Also, FIG. 9 is a timing chart showing an operation of a conventional semiconductor storage device.

The timing chart of FIG. 9 corresponds to an operation of a configuration that is obtained by removing the clamp circuit 103A from the configuration of FIG. 1 of Embodiment 1 of the present invention.

As also described in Embodiment 1 of the present invention (FIG. 1), an operation in which a selected bit line or the like is caused to have a negative potential during a write operation, will be described. For example, the word line WL1 is selected and caused to go to the H level. Also, the write control signal WT1 is selected and caused to go to the H level. Therefore, the N-type MOS transistor QN5 in the column selection circuit 102 connected to the bit line BL1 is turned ON, so that the bit line BL1 and the capacitance element output node COUT are connected to each other via the N-type MOS transistor QN5. In this case, since the capacitance element control signal CIN is at the H level and the N-type MOS transistor QN7 is ON, electric charges are extracted from the bit line BL1 via the N-type MOS transistor QN7, so that the potential of the bit line BL1 goes to the L level (0 V) after a predetermined time (corresponding to the time T1 in FIG. 9) elapses.

After the potential of the bit line BL1 becomes 0 V, the capacitance element control signal CIN is caused to go from the H level to the L level. Since the capacitance element control signal CIN goes to the L level, the N-type MOS transistor QN7 is turned OFF. Meanwhile, assuming that the capacitance of the capacitance element CAP is Cc, when the capacitance element control signal CIN goes from the H level (VDD) to the L level (0 V), an amount of electric charges corresponding to Cc×VDD are extracted from electric charges in all capacitances (capacitance C1) of the bit line BL1, the capacitance element output node COUT and the storage node (in this case, the source terminal node of the access transistor QN3) of the selected memory cell 100.

Specifically, by division of electric charges by the capacitance Cc and the capacitance C1, the potential of the bit line BL1 or the like is changed from 0 V to −(Cc×VDD)/(Cc+C1), i.e., a negative potential.

Here, a case where, as shown in the timing chart of FIG. 10, a time from when the word line WL1 is activated to when the capacitance element control signal CIN goes from the H level to the L level, is a time T2 that is shorter than the time T1 of FIG. 9, will be described.

In this case, before the potential of the bit line BL1 goes to 0 V, the capacitance element control signal CIN is caused to go from the H level to the L level. Assuming that the potential of the bit line BL1 when the capacitance element control signal CIN is caused to go from the H level to the L level is VBL, the potential of the bit line BL1 or the like when the capacitance element control signal CIN is caused to go from the H level to the L level, is (C1×VBL−Cc×VDD)/(Cc+C1). As in the operation of the conventional semiconductor storage device of FIG. 9, the potential of the bit line BL1 or the like can be controlled so that it has a higher value than when the capacitance element control signal CIN is caused to go from the H level to the L level after the potential of the bit line BL1 becomes 0 V.

If timing is controlled as in Embodiment 3 of the present invention so that, during a write operation, the capacitance element control signal CIN is changed to drive the capacitance element CAP before the potential of a bit line becomes 0 V, then when the power supply voltage VDD is low, a data write characteristic to the memory cell 100 can be improved as in the conventional art, and further, when the power supply voltage VDD increases, the potential of a selected bit line or the like during a data write operation to a memory cell 100 can be controlled so that it is higher than that in the conventional art. Therefore, electrical stress to each element connected to a selected bit line or the like can be reduced, so that a deterioration in reliability can be suppressed. Also, it is possible to prevent destruction of data held by a non-selected memory cell connected to a selected bit line.

The time T1 of FIG. 9 may be changed to the time T2 of FIG. 10 as follows, for example. If the operation timing of the capacitance element control signal CIN is determined from the timing of activation of a word line or activation of a write control signal using a delay circuit or the like, the delay circuit may be changed so that the number of connection stages of delay elements (inverters, etc.) is reduced. Also, a switching circuit or the like including a switching means in a delay circuit may be used to finely adjust a time. Also, the switching timing of the capacitance element control signal CIN may be changed using an external control signal.

Embodiment 4 of the Invention

Figure 11:
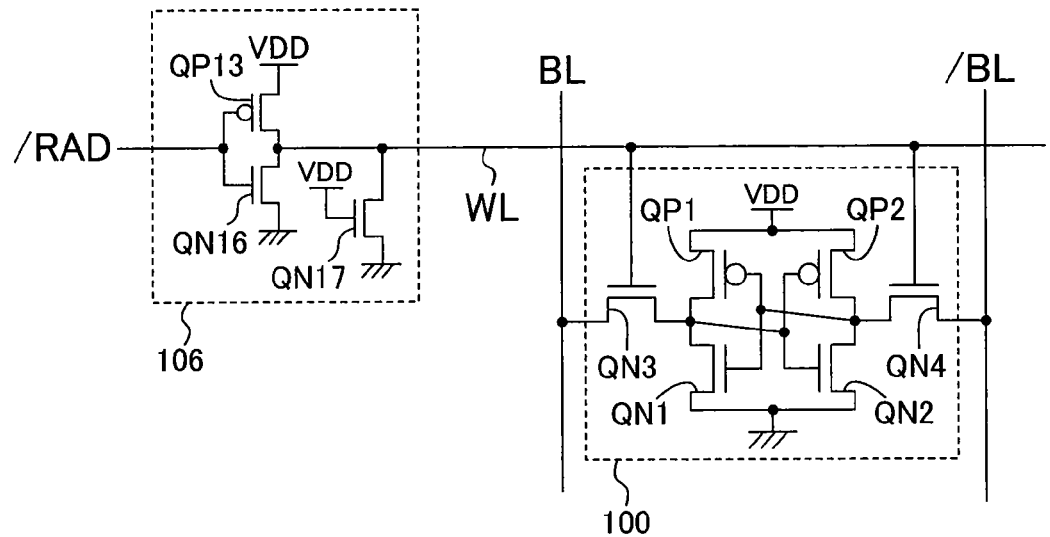
FIG. 11 is a diagram showing a configuration of a semiconductor storage device according to Embodiment 4 of the present invention.

FIG. 11 is a diagram showing a configuration of a semiconductor storage device according to Embodiment 4 of the present invention. The semiconductor storage device of FIG. 11 comprises a memory cell 100 including drive transistors QN1 and QN2, access transistors QN3 and QN4, and load transistors QP1 and QP2, and a word driver circuit 106 including a P-type MOS transistor QP13 and N-type MOS transistors QN16 and QN17. The semiconductor storage device of FIG. 11 further comprises a word line WL, bit lines BL and /BL, a row address signal /RAD, and a power supply voltage VDD.

Parts other than the word driver circuit 106 are assumed to be the same as a configuration (conventional semiconductor storage device) obtained by removing the clamp circuit 103A from the configuration of FIG. 1 of Embodiment 1 of the present invention, though they are not shown for the sake of simplicity. Therefore, during a write operation to the memory cell 100, the potential of the bit line BL or the like is lower than the negative potential VBB. The memory cell 100 is the same as that described in Embodiment 1 of the present invention and will not be described.

In the word driver circuit 106, a P-type MOS transistor QP13 and an N-type MOS transistor QN16 are connected in series between the power supply voltage VDD and a ground power supply voltage so that an inversion of the row address signal /RAD is output to the word line WL. Also, an N-type MOS transistor QN17 having a gate terminal connected to the power supply voltage VDD is provided between the word line WL and the ground power supply voltage, so that when the row address signal /RAD is at the L level and the word line WL goes to the H level (the word line goes to the active state), the H level of the word line WL can be controlled so that it is a potential that is lower than the power supply voltage VDD. When the row address signal /RAD is at the H level and the word line WL is at the L level (the word line is in the nonactive state), the N-type MOS transistor QN17 does not have an influence on the word line WL.

A word driver circuit of a typical semiconductor storage device (conventional semiconductor storage device) outputs a VDD level that is equal to a power supply voltage, as the H level of the word line WL. In other words, the N-type MOS transistor QN17 is not provided. Therefore, in conventional semiconductor storage devices, when data is written into the memory cell 100, an activated word line is at the VDD level and the potential of the bit line BL is the negative potential VBB that is lower than 0 V, so that the potential difference between the gate terminal and the drain terminal of the access transistor QN3 in the memory cell 100 is higher than VDD, specifically VDD+|VBB|.

Therefore, as in this embodiment, if the H level of the word line WL is controlled so that it is a potential that is lower than the power supply voltage VDD, the potential difference between the gate terminal and the drain terminal of the access transistor QN3 in the memory cell 100 can be reduced as compared to the conventional art, so that electrical stress to the access transistor QN3 of the memory cell 100 is reduced, whereby a deterioration in reliability can be suppressed.

The word driver circuit 106 of this embodiment is only for illustrative purposes. Any configuration in which the H-level potential of the word line WL in the active state can be controlled so that it is a potential that is lower than the power supply voltage VDD, can be used to obtain a similar effect.

Also, the configuration of this embodiment is applicable to Embodiments 1 to 3 of the present invention.

Embodiment 5 of the Invention

Figure 12:
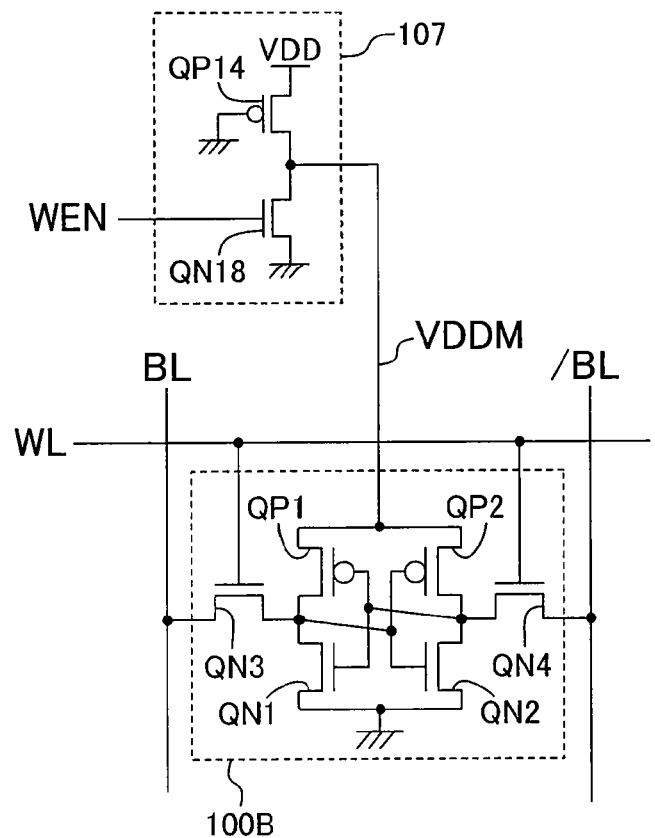
FIG. 12 is a diagram showing a configuration of a semiconductor storage device according to Embodiment 5 of the present invention.

FIG. 12 is a diagram showing a configuration of a semiconductor storage device according to Embodiment 5 of the present invention. The semiconductor storage device of FIG. 12 comprises a memory cell 100B including drive transistors QN1 and QN2, access transistors QN3 and QN4, and load transistors QP1 and QP2, and a memory cell power supply control circuit 107 including a P-type MOS transistor QP14 and an N-type MOS transistor QN18. The semiconductor storage device of FIG. 12 further comprises a word line WL, bit lines BL and /BL, a write enable signal WEN, a memory cell power supply voltage VDDM, and a power supply voltage VDD.

Parts other than the memory cell power supply control circuit 107 are assumed to be the same as a configuration (conventional semiconductor storage device) obtained by removing the clamp circuit 103A from the configuration of FIG. 1 of Embodiment 1 of the present invention, though they are not shown for the sake of simplicity. Therefore, during a write operation to the memory cell 100B, the potential of the bit line BL or the like is lower than the negative potential VBB that is lower than 0 V.

Also, the memory cell 100B has the same configuration as that of the memory cell 100 of FIG. 1, except that, instead of the power supply voltage VDD, the memory cell power supply voltage VDDM is connected to the load transistors QP1 and QP2.

In the memory cell power supply control circuit 107, the P-type MOS transistor QP14 having a gate terminal connected to a ground power supply voltage and the N-type MOS transistor QN18 having a gate terminal connected to the write enable signal WEN are connected in series between the power supply voltage VDD and the ground power supply voltage, and the voltage of the drain terminals of the connected P-type MOS transistor QP14 and N-type MOS transistor QN18 is output as the memory cell power supply voltage VDDM.

In the memory cell power supply control circuit 107, when it is not during a data write operation to the memory cell 100B, the write enable signal WEN is at the L level and therefore the N-type MOS transistor QN18 is OFF. Since the P-type MOS transistor QP14 is invariably ON, the memory cell power supply voltage VDDM is a VDD level that is equal to the power supply voltage.

When it is during a data write operation to the memory cell 100B, the write enable signal WEN goes to the H level and therefore the N-type MOS transistor QN18 is turned ON, so that the memory cell power supply voltage VDDM becomes a potential that is determined by a ratio of drive performance between the P-type MOS transistor QP14 and the N-type MOS transistor QN18. In other words, the memory cell power supply voltage VDDM can be controlled so that it is lower than the power supply voltage VDD.

A VDD level that is equal to a power supply voltage is applied to a memory cell power supply of a typical semiconductor storage device (conventional semiconductor storage device). In other words, in such a configuration, the memory cell power supply control circuit 107 is not provided.

In conventional semiconductor storage devices, during data write to a memory cell 100, the potential of the source terminal of the access transistor QN3 becomes the negative potential VBB that is lower than 0 V. Therefore, the drain terminal of the load transistor QP1, the drain terminal of the drive transistor QN1, the gate terminal of the load transistor QP2, and the gate terminal of the drive transistor QN2 that are connected to the source terminal of the access transistor QN3 each become the negative potential VBB that is lower than 0 V. Also, in conventional semiconductor storage devices, the VDD level is applied to the source terminals of the load transistors QP1 and QP2.

Therefore, a potential difference VDD+|VBB| that is larger than the power supply voltage VDD is applied between the drain terminal and the source terminal of the load transistor QP1, between the gate terminal and the drain terminal of the load transistor QP1, between the gate terminal and the drain terminal of the drive transistor QN1, the gate terminal and the source terminal of the load transistor QP2, between the gate terminal and the drain terminal of the load transistor QP2, and between the gate terminal and the drain terminal of the drive transistor QN2.

To avoid this, if the memory cell power supply voltage VDDM is controlled so that it is lower than the power supply voltage VDD during a data write operation to the memory cell 100B as in this embodiment, the potential difference applied to each terminal of the load transistors QP1 and QP2 and the drive transistors QN1 and QN2 in the memory cell 100B can be caused to be smaller than that in the conventional art. Therefore, electrical stress to the load transistors QP1 and QP2 and the drive transistors QN1 and QN2 in the memory cell 100B can be reduced, so that a deterioration in reliability can be suppressed.

The memory cell power supply control circuit 107 of this embodiment is only for illustrative purposes. Any configuration in which the memory cell power supply voltage can be controlled so that it is lower than the power supply voltage VDD during a data write operation to a memory cell 100B, can be used to obtain a similar effect.

Also, the configuration of this embodiment is applicable to Embodiments 1 to 4 of the present invention.

Embodiment 6 of the Invention

Figure 13:
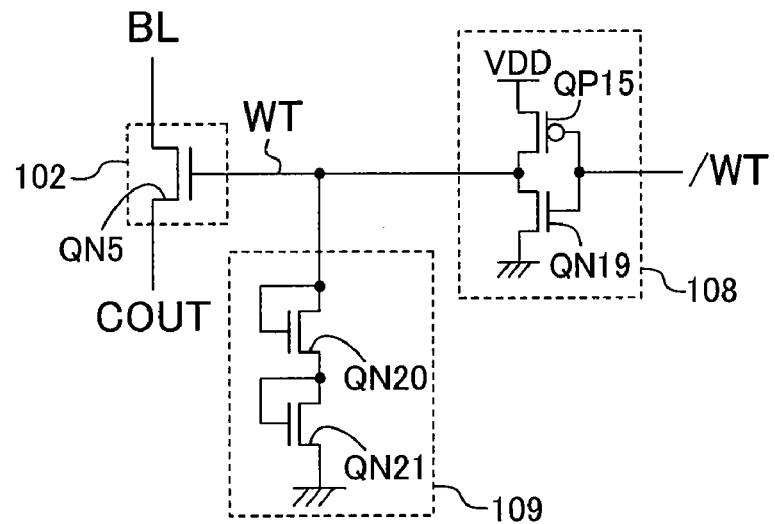
FIG. 13 is a diagram showing a configuration of a semiconductor storage device according to Embodiment 6 of the present invention.

FIG. 13 is a diagram showing a configuration of a semiconductor storage device according to Embodiment 6 of the present invention. The semiconductor storage device of FIG. 13 comprises a column selection circuit 102 including an N-type MOS transistor QN5, an inverter 108 including a P-type MOS transistor QP15 and an N-type MOS transistor QN19, and a clamp circuit 109 including N-type MOS transistors QN20 and QN21. The semiconductor storage device of FIG. 13 further comprises a bit line BL, a capacitance element output node COUT, a write control signal WT, an inverted write control signal /WT, and a power supply voltage VDD.

The configuration of this embodiment is obtained by adding the inverter 108 and the clamp circuit 109 to a configuration (conventional semiconductor storage device) that is obtained by removing the clamp circuit 103A from the configuration of FIG. 1 of Embodiment 1 of the present invention, though it is not shown for the sake of simplicity. Therefore, during a write operation to a memory cell 100, the potential difference between the bit line BL and the capacitance element output node COUT is the negative potential VBB that is lower than 0 V.

In the inverter 108, the P-type MOS transistor QP15 and the N-type MOS transistor QN19 are connected between the power supply voltage VDD and the ground power supply voltage, and the inverted write control signal /WT is input to the gate terminal of each transistor.

In the clamp circuit 109, the N-type MOS transistors QN20 and QN21 each having a gate terminal in diode connection are connected in series between the write control signal WT and the ground power supply voltage. Therefore, when it is not during a data write operation to a memory cell 100, the clamp circuit 109 does not have an influence on the write control signal WT, because the inverted write control signal /WT is at the H level and the write control signal WT is at the L level.

During a data write operation to a memory cell 100, the inverted write control signal /WT is at the L level and the write control signal WT is at the H level. In this case, assuming that the threshold voltage of the N-type MOS transistor is 0.6 V, when the power supply voltage VDD is lower than 1.2 V, the clamp circuit 109 is inactive and does not have an influence on the H level (VDD level) of the write control signal WT. When the power supply voltage VDD becomes higher than 1.2 V, the clamp circuit 109 is activated, so that the H level of the write control signal WT becomes a potential that is determined by a ratio of drive performance between the P-type MOS transistor QP15 and the clamp circuit 109. In other words, the H level of the write control signal WT is controlled so that it is lower than the power supply voltage VDD.

The VDD level that is equal to the power supply voltage is invariably applied to the H-level potential of the write control signal WT of a typical semiconductor storage device (conventional semiconductor storage device).

In conventional semiconductor storage devices, during data write to a memory cell 100, the potential of the bit line BL or the capacitance element output node COUT is the negative potential VBB that is lower than 0 V, so that the potential difference VDD+|VBB| that is larger than the power supply voltage VDD is applied between the gate terminal and the drain terminal or between the gate terminal and the source terminal of the N-type MOS transistor QN5 of the column selection circuit 102.

To avoid this, if the H level of the write control signal WT is controlled so that it is lower than the power supply voltage VDD during a data write operation to a memory cell 100 as in this embodiment, the potential difference applied between the gate terminal and the drain terminal or between the gate terminal and the source terminal of the N-type MOS transistor QN5 of the column selection circuit 102, can be caused to be smaller than that in the conventional art. Therefore, electrical stress to the N-type MOS transistor QN5 of the column selection circuit 102 can be reduced, so that a deterioration in reliability can be suppressed.

The circuit configuration of this embodiment in which the H level of the write control signal WT is controlled so that it is lower than the power supply voltage VDD, is only for illustrative purposes. Any configuration in which the H level of the write control signal WT can be controlled so that it is lower than the power supply voltage VDD during a data write operation to a memory cell 100, can be used to obtain a similar effect.

Also, the configuration of this embodiment is applicable to Embodiments 1 to 5 of the present invention.

Embodiment 7 of the Invention

Figure 14:
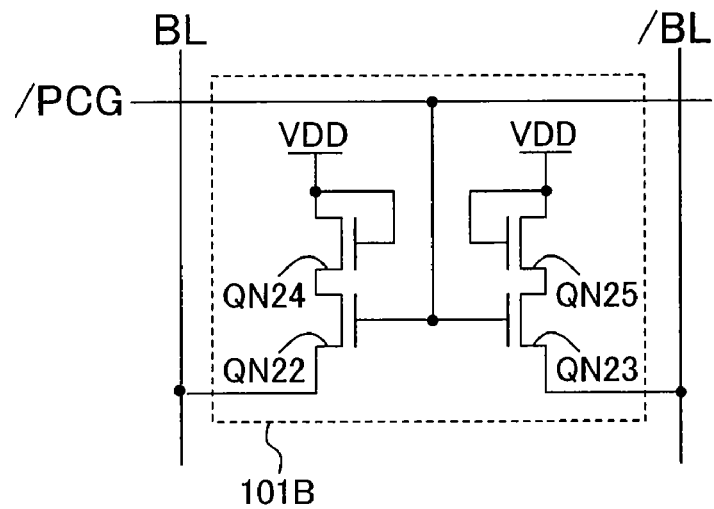
FIG. 14 is a diagram showing a configuration of a semiconductor storage device according to Embodiment 7 of the present invention.

FIG. 14 is a diagram showing a configuration of a semiconductor storage device according to Embodiment 7 of the present invention. The semiconductor storage device of FIG. 14 comprises a precharge circuit 101B including N-type MOS transistors QN22, QN23, QN24, and QN25. The semiconductor storage device of FIG. 14 further comprises bit lines BL and /BL, a precharge signal /PCG, and a power supply voltage VDD.

The configuration of this embodiment is obtained by replacing the precharge circuit 101 with the precharge circuit 101B of FIG. 14 in a configuration (conventional semiconductor storage device) that is obtained by removing the clamp circuit 103A from the configuration of FIG. 1 of Embodiment 1 of the present invention, though it is not shown for the sake of simplicity. Therefore, during a write operation to a memory cell 100, the potential of the bit line BL or the like is the negative potential VBB that is lower than 0 V.

In the precharge circuit 101B, the N-type MOS transistor QN24 having a gate terminal in diode connection and the N-type MOS transistor QN22 are connected in series between the power supply voltage VDD and the bit line BL, the N-type MOS transistor QN25 having a gate terminal in diode connection and the N-type MOS transistor QN23 are connected in series between the power supply voltage VDD and the bit line /BL, and the precharge control signal /PCG is connected to the gate terminals of the N-type MOS transistors QN22 and QN23.

In the precharge circuit 101B, when a word line is in the non-active state, the precharge control signal /PCG is caused to go to the H level, so that the N-type MOS transistors QN22 and QN23 are turned ON and therefore the bit lines BL and /BL are precharged to the H level. Assuming that the threshold voltage of the N-type MOS transistor is represented by VTN and the H-level precharge potential of a bit line is represented by VBP, VBP=VDD−VTN, i.e., the H-level precharge potential of the bit line is controlled so that it is lower than the power supply voltage VDD. When a word line goes to the active state, the precharge control signal /PCG is caused to be at the L level, so that the N-type MOS transistors QN22 and QN23 are turned OFF not to have an influence on the bit lines BL and /BL.

A precharge circuit of a typical semiconductor storage device (conventional semiconductor storage device) includes a P-type MOS transistor as in the precharge circuit 101 of FIG. 1. The H-level precharge potential of a bit line is the VDD level that is equal to the power supply voltage.

In conventional semiconductor storage devices, during data write to a memory cell 100, the potential of a bit line or the capacitance element output node COUT is the negative potential VBB that is lower than 0 V. In this case, the potential difference VDD+|VBB| that is larger than the power supply voltage VDD is applied between the drain terminal and the source terminal of an N-type MOS transistor connected to a non-selected bit line in the column selection circuit 102 (assuming that a selected bit line is BL1, the N-type MOS transistor connected to the non-selected bit line is an N-type MOS transistor that receives the write control signals /WT1, WT2 and /WT2 at the gate terminal thereof). Also, VDD+|VBB| that is larger than the power supply voltage VDD is applied between the gate terminal and the drain terminal or between the source terminal and the drain terminal of a P-type MOS transistor in a precharge circuit connected to the selected bit line BL1 (e.g., the P-type MOS transistor QP3 connected to the bit line BL1 of FIG. 1).

To avoid this, as in this embodiment, if the H-level precharge potential of a bit line is controlled so that it is lower than the power supply voltage VDD, a potential difference applied to the drain terminal and the source terminal of an N-type MOS transistor connected to a non-selected bit line in a column selection circuit, or a potential difference applied between the gate terminal and the drain terminal and between the source terminal and the drain terminal of the precharge circuit transistor QN22 or QN23 connected to a selected bit line, can be caused to be smaller than that in the conventional art. Therefore, electrical stress to an N-type MOS transistor connected to a non-selected bit line in a column selection circuit or the precharge circuit transistor QN22 or QN23 connected to a selected bit line, can be reduced, so that a deterioration in reliability can be suppressed.

In this embodiment, the N-type MOS transistors QN24 and QN25 each having a gate terminal in diode connection in the precharge circuit 101B may be each replaced with a P-type MOS transistor having a gate terminal in diode connection. In this case, the same effect is obtained.

Also, even when the N-type MOS transistors QN22 and QN23 are each replaced with a P-type MOS transistor and the polarity of the precharge signal /PCG is inverted, a similar operation can be performed. In the case of the P-type MOS transistor, since a substrate potential is at the power supply voltage VDD, the potential difference VDD+|VBB| that is larger than the power supply voltage VDD is applied between the drain terminal and the substrate. In the case of the N-type MOS transistor, the substrate potential is determined by a ground power supply voltage.

Therefore, regarding the polarity of transistors connected to the bit lines BL and /BL, the potential difference applied between the drain terminal and the substrate can be smaller in the case of P type than that in the case of N type. Therefore, in the case of P type, electrical stress to the precharge circuit 101B can be reduced, so that a deterioration in reliability can be suppressed.

Also, the configuration of this embodiment is applicable to Embodiments 1 to 6 of the present invention.

In the semiconductor storage devices described above, a single or a small number of memory cells, precharge circuits, column selection circuits, clamp circuits, capacitance elements, word lines, bit lines and the like are provided for the sake of easy understanding. However, a plurality of (a large number of) these elements may be provided. A semiconductor storage device having such a configuration can exhibit the same effect as that of the semiconductor storage devices of the embodiment described above.

In the semiconductor storage device of the present invention, a data write characteristic to a memory cell with a low power supply voltage can be improved by controlling the potential of a bit line. Particularly, a deterioration in reliability of each element can be suppressed, and the semiconductor storage device can have stable write performance and low power consumption. Thus, the present invention is useful as a semiconductor storage device, such as a static random access memory or the like.

What is claimed is:

1. A semiconductor storage device comprising:
a plurality of word lines;
a plurality of bit lines;
a plurality of memory cells provided at intersections of the word lines and the bit lines;
a precharge circuit connected to the bit lines; and
a write circuit connected to the bit lines,
wherein the write circuit includes:
a column selection circuit controlled by a write control signal;
a first control circuit for controlling a potential of a selected bit line so that the potential of the selected bit line is a first potential;
a second control circuit for controlling the potential of the selected bit line so that the potential of the selected bit line is a second potential that is lower than the first potential; and
a clamp circuit for clamping the second potential.

2. The semiconductor storage device of claim 1, wherein the clamp circuit controls a voltage applied to each element included in the memory cells, the precharge circuit and the write circuit so that the voltage is a third potential that is higher than the second potential.

3. The semiconductor storage device of claim 1, wherein the clamp circuit is connected to an output of the second control circuit, and
a reduction rate of an L level of the output of the second control circuit decreases with an increase in a power supply voltage.

4. The semiconductor storage device of claim 3, wherein the clamp circuit includes one or more diode characteristic elements.

5. The semiconductor storage device of claim 3, wherein the clamp circuit includes a transistor connected between the output of the second control circuit and a power supply terminal, and
an output potential of the second control circuit is controlled by controlling a gate voltage of the transistor.

6. The semiconductor storage device of claim 3, wherein one or more switches are provided and connected in parallel with elements included in the clamp circuit, and an output potential of the second control circuit is adjusted by a combination of the switches.

7. The semiconductor storage device of claim 3, wherein the clamp circuit is disabled when it is not during data write to the memory cells.

8. The semiconductor storage device of claim 1, wherein the clamp circuit is connected to an input of the second control circuit, and
a reduction rate of an H level of the input of the second control circuit increases with an increase in a power supply voltage.

9. The semiconductor storage device of claim 8, wherein the clamp circuit includes one or more diode characteristic elements.

10. The semiconductor storage device of claim 8, wherein the clamp circuit includes a transistor connected between the input of the second control circuit and a power supply terminal, and
an input potential of the second control circuit is controlled by controlling a gate voltage of the transistor.

11. The semiconductor storage device of claim 8, wherein one or more switches are provided and connected in parallel with elements included in the clamp circuit, and an input potential of the second control circuit is adjusted by a combination of the switches.

12. The semiconductor storage device of claim 8, wherein the clamp circuit is disabled when it is not during data write to the memory cells.

13. A semiconductor storage device comprising:
a plurality of word lines;
a plurality of bit lines;
a plurality of memory cells provided at intersections of the word lines and the bit lines;
a precharge circuit connected to the bit lines; and
a write circuit connected to the bit lines,
wherein the write circuit includes:
- a column selection circuit controlled by a write control signal;
- a first control circuit for controlling a potential of a selected bit line so that the potential of the selected bit line is a first potential; and
- a second control circuit for controlling the potential of the selected bit line so that the potential of the selected bit line is a second potential that is lower than the first potential, and during data write to the memory cells, the second control circuit is driven before a potential of the selected bit line goes to the first potential.

14. The semiconductor storage device of claim 13, wherein the second control circuit is driven at a more higher potential of the bit line than the first potential with an increase in the power supply voltage.

15. A semiconductor storage device comprising:
a plurality of word lines;
a plurality of bit lines;
a plurality of memory cells provided at intersections of the word lines and the bit lines;
a precharge circuit connected to the bit lines; and
a write circuit connected to the bit lines,
wherein the write circuit includes:
- a column selection circuit controlled by a write control signal;
- a first control circuit for controlling a potential of a selected bit line so that the potential of the selected bit line is a first potential; and
- a second control circuit for controlling the potential of the selected bit line so that the potential of the selected bit line is a second potential that is lower than the first potential, and at least one of a potential applied to the memory cells, a potential applied to the column selection circuit, and a potential output from the precharge circuit is controlled so that the at least one potential is a predetermined potential.

16. The semiconductor storage device of claim 15, wherein during data write to the memory cells, a potential of a word line applied to the memory cells is lower than a power supply voltage.

17. The semiconductor storage device of claim 15, wherein during data write to the memory cells, a memory cell power supply voltage applied to the memory cells is lower than a power supply voltage.

18. The semiconductor storage device of claim 15, wherein during data write to the memory cells, a potential of a write control signal applied to the column selection circuit is lower than a power supply voltage.

19. The semiconductor storage device of claim 15, wherein an output potential from the precharge circuit before data write to the memory cells is lower than a power supply voltage.

20. The semiconductor storage device of claim 19, wherein the precharge circuit includes transistors, and of the transistors, the polarity of a transistor connected to the bit line is of N channel type.

* * * * *